AMPLIFIER WHICH CHANGES ITS FREQUENCY RESPONSE WITH TIME

Filed June 22, 1943

INVENTOR
SHELDON H. DIKE
BY Stone E. Bush
ATTORNEY

United States Patent Office
3,048,791
Patented Aug. 7, 1962

3,048,791

AMPLIFIER WHICH CHANGES ITS FREQUENCY RESPONSE WITH TIME

Sheldon H. Dike, Ventnor, N.J., assignor to the United States of America as represented by the Secretary of the Navy Filed June 22, 1943, Ser. No. 491,839
4 Claims. (Cl. 330—185)

This invention relates to thermionic amplifying devices and has particular reference to a novel amplifier which changes its frequency response with time.

While the amplifier of my invention may be used for various purposes it may be employed to particular advantage in a radio-operated proximity fuze of the type disclosed in a co-pending application of M. A. Tuve et al., Serial No. 471,388, filed January 6, 1943, now abandoned. The fuze there shown comprises an oscillator coupled to an antenna, and an amplifier coupled to the oscillator and operable to trigger a thyratron for energizing an electric detonator in response to reflection by a nearby target of electro-magnetic waves emitted from the antenna. It has been found that in fuzes of this type it is desirable to have a peak response of the amplifier at about 250 cycles for relatively close range service, and a peak response at approximately 30 cycles for long range service, assuming a constant time delay for operation of the detonator. These frequency values depend upon the velocity of the projectile containing the fuze, the range and the oscillator frequency. In view of this change of the frequency at which a peak response is desired, with the projectile flight time, satisfactory results cannot be obtained with a conventional form of amplifier.

One object of the present invention, therefore, resides in the provision of a novel amplifier in which the frequency response varies with time by reason of the inclusion in the amplifier of a time control element, such as a thermistor which changes its resistance with time. The new amplifier, in its preferred form, comprises one or more vacuum amplifier tubes, and a thermistor connected through a coupling condenser to the input grid terminal of the first amplifier tube. The thermistor has a relatively high resistance for the first few seconds of flight of the projectile, its resistance decreasing to as near the zero as possible by the time the projectile has reached a relatively long range, such as 5000 yards. The effect of this changing resistance of the thermistor is to provide the amplifier with a peak response at a relatively high frequency in the initial stages of the projectile flight, and a peak response at a relatively low frequency in the latere stages of its flight.

Another object of the invention is to provide an amplifier of simple construction for use in a radio proximity fuze, whereby the fuze is made effective to substantially the same degree at all ranges.

Figure 1:
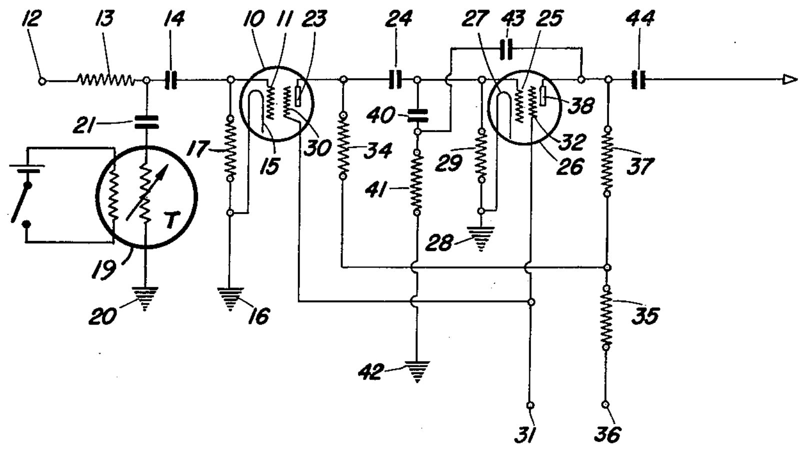
Figure 2:
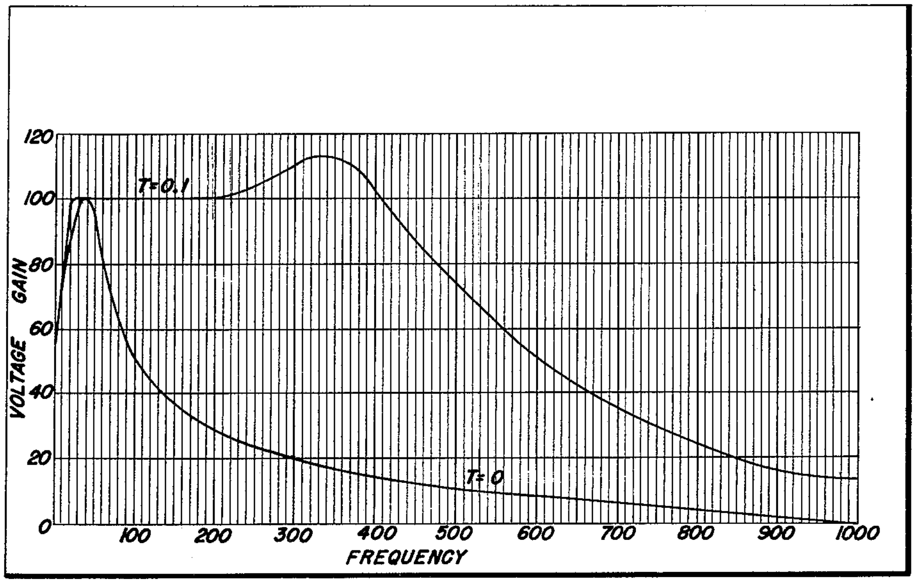

These and other objects of the invention may be better understood by reference to the accompanying drawing, in which FIG. 1 is a schematic wiring diagram of one form of the new amplifier, and FIG. 2 is a chart showing the frequency response of the amplifier at two different values of the thermistor resistance.

Referring to the drawing, the amplifier there shown comprises a vacuum tube 10 having a control grid 11 coupled to an input terminal 12, which may be a suitable point in the oscillator of a radio proximity fuze. The input terminal 12, as shown, is coupled to the grid 11 through a resistor 13 and a condenser 14. The cathode 15 of the amplifier tube is energized from any suitable current source (not shown) in part through a ground connection 16. A resistor 17 is connected between the cathode and a grid 11.

A thermistor 19 is connected at one side to a ground connection 20 and at the other side through a coupling condenser 21 to the circuit of the grid 11 between the resistor 13 and the condenser 14. The thermistor 19 may be of any conventional type which changes its resistance with temperature and thus with time of heating but is preferably of the indirectly heated type to which a current source is connected as illustrated in FIG. 1. More particularly, when the thermistor is initially energized, its resistance is relatively high, for example, in the order of .10 megohm, but its resistance decreases to substantially zero after a predetermined time interval.

The plate 23 of the amplifying tube 10 is connected through a coupling condenser 24 to the control grid 25 of a second vacuum tube 26. The cathode 27 of the tube 26 which is also connected as an amplifier is energized partly through a ground connection 28 and is connected through a resistor 29 to the grid 25. A screen grid 30 in the first tube 10 is connected to a terminal 31 to which is connected a suitable voltage source (not shown) for the screen. The terminal 31 is also connected to a screen grid 32 in the second amplifier tube 26. The plate circuit of the vacuum tube 10 is connected, at a point between the plate 23 and the condenser 24, through resistors 34 and 35 to a terminal 36 of a current source (not shown), such as a 90 volt battery. The terminal 36 is also connected to the plate 38 of the second tube 26 through the same resistor 35 and a resistor 37.

At a point between the condenser 24 and the grid 25, the grid circuit of the second tube 26 is coupled through a condenser 40, a resistor 41 and a ground connection 42. A condenser 43 is connected at one side between the resistor 41 and the condenser 40 and at the other side to the plate 38, the output of the amplifier being led from the plate 38 through a coupling condenser 44. The condensers 40 and 43 and resistor 41 constitute a selective negative feedback system, the electrical constants of which are such as to sharpen the response and stabilize the amplifier against the effects of varying battery voltages.

In the operation of the amplifier, the thermistor 19 initially affords a high resistance when the projectile is fired from a gun, with the result that the impedance to high frequencies offered by thermistor 19 and condenser 21 is relatively high, providing a good response to high frequencies. However, during the flight of the projectile the resistance of the thermistor decreases, lowering the impedance to ground to high frequencies and causing a decrease in the frequency at which peak response occurs. Thus, the series circuit of condenser 21 and thermistor 19 operates in the same general manner as a conventional tone control circuit shunting the input of the amplifier.

The effect of the change in the resistance of thermistor 19 is illustrated in FIG. 2, where abscissas represent frequency and ordinates represent the voltage gain of the amplifier. The upper curve ($T=0.1$ meg.) represents frequency plotted against voltage gain during the initial flight of the projectile, that is, when the resistance of the thermistor 19 is relatively high, while the lower curve ($T=0$ ohms) represents frequency plotted against voltage gain at the final stage of the projectile flight, that is, when the resistance of the thermistor is negligible. It will be observed that the peak voltage gain during the initial flight of the projectile ($T=0.1$ meg.) is extended somewhat farther than the 250 cycles required at 100 megacycles (for an initial projectile velocity of 2600 feet per second) and, therefore, the amplifier is adapted for use with oscillators operated at frequencies greater than 100 megacycles. As shown by the lower curve ($T=0$ ohms), the peak voltage gain in the final stages of the projectile flight lies between 30 and 40 cycles, which is desirable in fuzes of the type described.

It will be understood that the thermistor 19 and condenser 21 need not be placed in the input circuit but, with proper choice of the components, may be arranged to shunt the input of either stage or to shunt the plate of either stage.

I claim:

1. A compensating amplifier system for a proximity fuze comprising an amplifier circuit and an auxiliary circuit connected to the input end of said amplifier circuit, said auxiliary circuit comprising a capacitor and a thermistor in series therewith, and means for heating said thermistor to decrease its resistance with elapsed time, whereby the impedance of said auxiliary circuit of relatively high frequency decreases with elapsed time, thus progressively decreasing the peak frequency response of the amplifier.

2. In a proximity fuze for use in projectiles having decreasing velocity with elapse of flight time, a compensating amplifier system comprising an input terminal, an output terminal, a thermionic amplifier coupling said terminals, and a frequency selective control circuit connected to the input terminal of the thermionic amplifier, said control circuit including in series circuit relation a capacitor and a thermistor, and means for heating said thermistor to reduce its resistance with elapsed time, whereby the impedance of said control circuit continuously decreases for relatively high frequency with elapse of time, thus progressively decreasing the peak frequency response of the amplifier.

3. In a projectile having a decreasing velocity with elapsed flight time, a compensating amplifier circuit having a peak response at a relatively high frequency in the initial stages of the projectile flight, and a peak response at a relatively low frequency in the later stages of its flight, said amplifier circuit including an input terminal, an output terminal, a thermionic amplifier coupling said terminals, and a control circuit connected to the input terminal of the amplifier, said control circuit including a capacitor and a thermistor in series circuit relation, and a heater element applied to said thermistor and operative to decrease the thermistor resistance with elapsed time to decrease the peak frequency response of the amplifier with elapsed time.

4. In an amplifier device for a proximity fuze for use in projectiles having decreasing velocity with elapse of time, an input circuit, an output circuit, a thermionic amplifier coupling said circuits, and means for decreasing the peak frequency response of the amplifier with elapsed time, said means consisting of a bypass circuit connected to said input circuit, said by-pass circuit comprising a capacitor and a thermistor connected in series circuit relation and a heater element applied to said thermistor and operative to decrease the thermistor resistance with elapsed time to decrease the peak frequency response of the amplifier with elapsed time.

References Cited in the file of this patent

UNITED STATES PATENTS

| | | |
|---|---|---|
| 1,931,596 | Wheeler | Oct. 24, 1933 |
| 2,054,839 | Starrett | Sept. 22, 1936 |
| 2,072,968 | Sinnett | Mar. 9, 1937 |
| 2,103,490 | Peterson | Dec. 28, 1937 |
| 2,129,074 | Thierbach | Sept. 6, 1938 |
| 2,148,030 | McLennan | Feb. 21, 1939 |
| 2,167,462 | Rechnitzer | July 25, 1939 |
| 2,230,649 | Mason | Feb. 4, 1941 |
| 2,239,042 | Kleber et al. | Apr. 22, 1941 |
| 2,313,096 | Shepard | Mar. 9, 1943 |
| 2,330,499 | Lehfeldt | Sept. 28, 1943 |